United States Patent
Chen et al.

(10) Patent No.: US 10,217,789 B2
(45) Date of Patent: Feb. 26, 2019

(54) INTERPOSER AND CHIP-SCALE PACKAGING FOR WAFER-LEVEL CAMERA

(71) Applicant: OmniVision Technologies, Inc., Santa Clara, CA (US)

(72) Inventors: Teng-Sheng Chen, Hsinchu (TW); Chia-Yang Chang, Sunnyvale, CA (US); Yi Qin, Shanghai (CN)

(73) Assignee: OmniVision Technologies, Inc., Santa Clara, CA (US)

( * ) Notice: Subject to any disclaimer, the term of this patent is extended or adjusted under 35 U.S.C. 154(b) by 132 days.

(21) Appl. No.: 15/091,753

(22) Filed: Apr. 6, 2016

(65) Prior Publication Data

US 2017/0294477 A1    Oct. 12, 2017

(51) Int. Cl.
*H01L 27/146* (2006.01)

(52) U.S. Cl.
CPC .. *H01L 27/14685* (2013.01); *H01L 27/14627* (2013.01); *H01L 27/14632* (2013.01); *H01L 27/14643* (2013.01); *H01L 27/14687* (2013.01)

(58) Field of Classification Search
CPC ......... H01L 27/14627; H01L 27/14632; H01L 27/14643; H01L 27/14687; H01L 27/14685; G02B 13/0085
See application file for complete search history.

(56) References Cited

U.S. PATENT DOCUMENTS

| | | | |
|---|---|---|---|
| 2006/0044450 A1* | 3/2006 | Wolterink | G02B 13/006 348/340 |
| 2010/0073534 A1* | 3/2010 | Yano | B29D 11/00432 348/294 |
| 2010/0157446 A1* | 6/2010 | Sander | G02B 13/003 359/771 |
| 2011/0304930 A1* | 12/2011 | Welch | H01L 27/14618 359/796 |
| 2012/0218648 A1* | 8/2012 | Lin | G02B 13/0085 359/715 |
| 2014/0339664 A1* | 11/2014 | Rossi | H01L 27/14618 257/432 |
| 2015/0333094 A1* | 11/2015 | Wan | G02B 7/02 250/208.1 |

\* cited by examiner

*Primary Examiner* — Bilkis Jahan
*Assistant Examiner* — Victor Barzykin
(74) *Attorney, Agent, or Firm* — Lathrop Gage, LLP

(57) ABSTRACT

A chip-scale packaging process for wafer-level camera manufacture includes aligning an optics component wafer with an interposer wafer having a photoresist pattern that forms a plurality of transparent regions, bonding the aligned optics component wafer to the interposer wafer, and dicing the bonded optics component wafer and interposer wafer such that each optics component with interposer has a transparent region. The process further includes dicing an image sensor wafer, aligning the pixel array of each image sensor with the transparent region of a respective optics component with interposer, and bonding each image sensor to its respective optics component with interposer. Each interposer provides alignment between its respective optics component center and its respective pixel array center of the image sensor based on the respective transparent region. The interposer further provides a back focal length for focusing light from the optics component onto a top surface of the pixel array.

14 Claims, 15 Drawing Sheets

INTERPOSER AND CHIP-SCALE PACKAGING FOR WAFER-LEVEL CAMERA

BACKGROUND

This disclosure relates to the manufacture of optoelectronic devices such as wafer-level cameras, and particularly, improved structures and processes for manufacturing these devices.

Wafer-level cameras include miniaturized optics and sensors made separately using semiconductor-like techniques and bonded together. As smaller cameras are designed for use with for example mobile devices, reduction in the size of the optics and sensors creates manufacturing constraints that may complicate the bonding process and packaging of the camera or limit performance capabilities of the camera.

SUMMARY OF THE INVENTION

A chip-scale packaging process for wafer-level camera manufacture is provided. The process includes aligning an optics component wafer with an interposer wafer based on a photoresist pattern disposed on a first side of the interposer wafer, bonding the aligned optics component wafer to the first side of the interposer wafer, and dicing the bonded optics component wafer and interposer wafer into a plurality of optics components with interposers, such that each optics component with interposer includes a transparent region formed by the photoresist pattern. The process further includes dicing an image sensor wafer into a plurality of image sensors, wherein each of the plurality of image sensors has a pixel array, aligning the pixel array of each of the plurality of image sensors with a respective one of the plurality of optics components with interposers based on the transparent region of the optics component with interposer, and bonding each of the plurality of image sensors to its respective one of the plurality of optics components with interposers, thereby forming a plurality of wafer-level cameras.

In another embodiment, a chip-scale packaging process for wafer-level camera manufacture is provided. The process includes aligning an image sensor wafer with an interposer wafer such that a plurality of image sensor pixel arrays of the image sensor wafer are aligned with a plurality of transparent regions formed by a photoresist pattern disposed on a first side of interposer wafer, bonding the aligned image sensor wafer to the first side of the interposer wafer, and dicing the bonded image sensor wafer and interposer wafer into a plurality of image sensors with interposers, such that each image sensor with interposer includes a respective one of the plurality of transparent regions. The process further includes dicing an optics component wafer into a plurality of optics components, aligning each of the plurality of optics components with a respective one of the plurality of image sensors with interposers based on the transparent region of the respective image sensor with interposer, and bonding each of the plurality of optics components to its respective image sensor with interposer to form a plurality of wafer-level cameras.

In another embodiment, a chip-scale packaging process for wafer-level camera manufacture is provided. The process includes disposing a photoresist pattern on a first side of an interposer wafer to form a plurality of transparent regions, dicing the interposer wafer into a plurality of interposers such that each interposer includes a respective one of the plurality of transparent regions, and dicing an optics component wafer into a plurality of optics components, with each of the plurality of optics components having at least one lens. The process further includes dicing an image sensor wafer into a plurality of image sensors, with each of the plurality of image sensors having a pixel array, aligning each of the plurality of optics components with a respective one of the plurality of image sensors and a respective one of the plurality of interposers, based on the transparent region of the interposer, and bonding each of the plurality optics components and each of the plurality of image sensors to opposing respective sides of a respective one of the plurality of interposers, to form a plurality of wafer-level cameras.

In yet another embodiment, a chip-scale package wafer-level camera is provided. The wafer-level camera includes a pixel array having a top surface and a pixel array center, and a sensor package having a sensor package center misaligned from the pixel array center. The camera may further include an optics component having a bottom lens surface and an optical center, and an interposer having a first side and an opposing second side, with the optics component being bonded to the first side and the image sensor being bonded to the second side to form the wafer-level camera; the optical center is aligned with the pixel array center, and the interposer provides a back focal length between the bottom lens surface of the optics component and the top surface of the pixel array for focusing light from the optics component onto the top surface of the pixel array.

DETAILED DESCRIPTION

Figure 1:
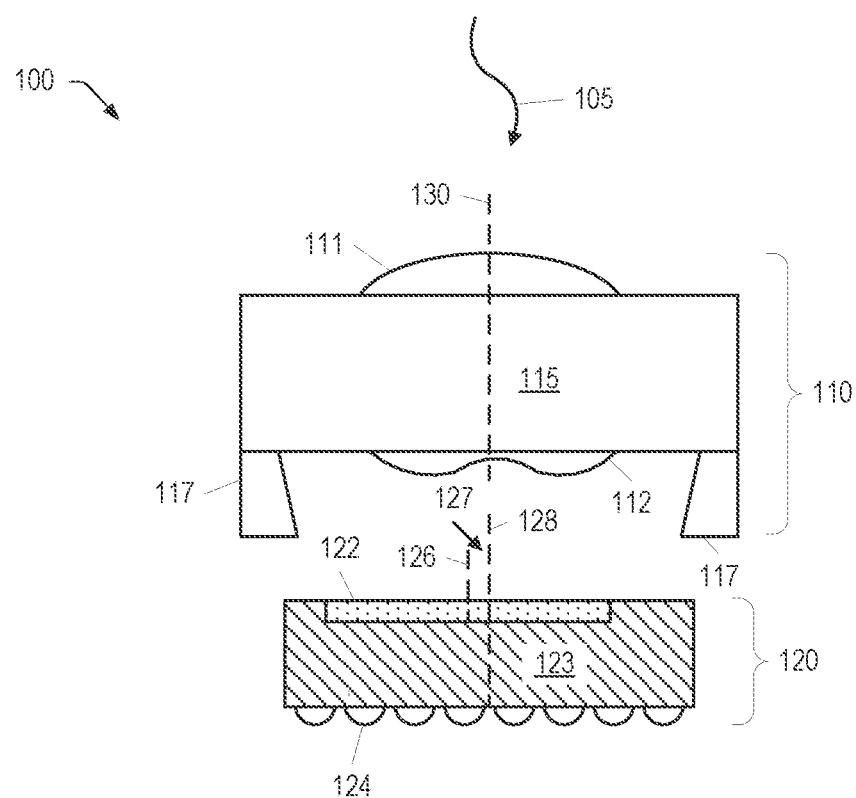
FIG. 1 is a schematic diagram showing components of a wafer-level camera, in an embodiment.

FIG. 1 is a schematic diagram showing components of a wafer-level camera 100. Wafer-level camera 100 includes an optics component 110 and an image sensor 120 prior to die bonding together. Light 105 arrives at wafer-level camera 100, passes through optics component 110, and is captured by image sensor 120. Optics component 110 is for example an optical wafer structure made using semiconductor stacking processes from wafer-level optical components and diced into a plurality of substantially identical optics components (see e.g., FIG. 18). Optics component 110 includes for example a first lens 111, a second lens 112, a lens package 115, and a spacer wafer 117. Optics component 110 has an optical center 130 defined by a central path of light through first and second lenses 111, 112. As shown in FIG. 1, optical center 130 coincides with the center of lens package 115, but optical center 130 and the center of lens package 115 may differ without departing from the scope hereof. Note that components of wafer-level camera 100 are not drawn to scale for clarity of illustration.

Image sensor 120 is for example a complementary metal-oxide semiconductor (CMOS) image sensor, which includes a pixel array 122, sensor package 123, and solder bumps 124. Image sensor 120 is made for example using semiconductor stacking processes from wafer-level components and diced into a plurality of substantially identical image sensors (see e.g., FIG. 17). Pixel array 122 is for example a two dimensional array of light-sensitive pixels in which each pixel includes a photodiode that converts photons of light into electrons. A location in the center of the two dimensional pixel array 122 defines a pixel array center 126. Sensor package 123 includes electrical connections, such as traces or wires, used to electrically connect individual pixels of pixel array 122 to the camera's electronics via solder bumps 124. Sensor package 123 may further include a coverslip, such as a thin glass coverslip, to cover pixel array 122 for protecting the light-sensitive pixels. A location in the center of the sensor package defines a sensor package center 128, which may coincide with, or differ from, the pixel array center 126. FIG. 1 shows sensor package center 128 misaligned from pixel array center 126 by an alignment difference 127. Note FIG. 1 shows alignment difference 127 in a first dimension, but alignment difference 127 may exist in both the first dimension and a second dimension without departing from the scope hereof.

Figure 2:
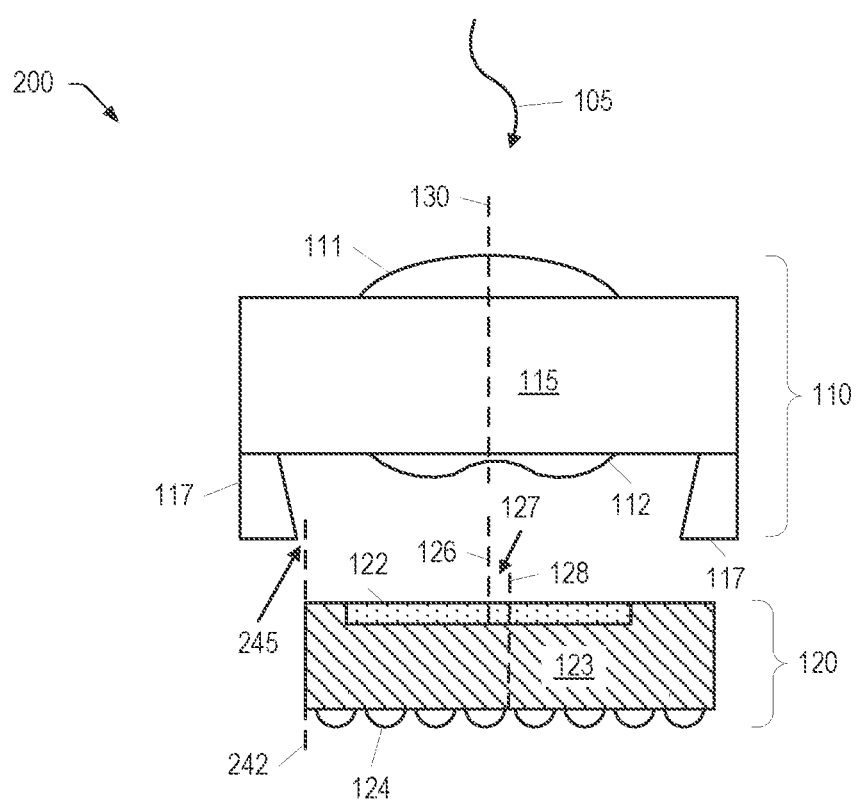
FIG. 2 is a schematic diagram showing components of the wafer-level camera of FIG. 1.

FIG. 2 is a schematic diagram showing components of a wafer-level camera 200, which is an example of wafer-level camera 100, FIG. 1. Identical items shown in FIGS. 1 and 2 are enumerated with identical reference numerals. Accordingly, their description is not repeated. In FIG. 1, sensor package center 128 is aligned with optical center 130. Ideally, however, pixel array center 126 is aligned with optical center 130 to properly capture light 105 passing through first lens 111 and second lens 112. In contrast to FIG. 1, FIG. 2 shows image sensor 120 shifted with respect to optics component 110 such that pixel array center 126 is ideally aligned directly beneath optical center 130 prior to die bonding together.

Due to a dimension mismatch between sensor package 123 and lens package 115 (e.g., sensor package 123 is narrower than lens package 115), combined with alignment of pixel array center 126 and optical center 130, a gap 245 is formed between a first image sensor end 242 and an inner edge of spacer wafer 117. Gap 245 prevents proper die bonding between optics component 110 and image sensor 120. Note that gap 245 is not drawn to scale for clarity of illustration. In an embodiment, gap 245 is not an actual gap but instead represents an insufficient overlap between image sensor 120 and spacer wafer 117 that prevents proper die bonding therebetween. Without proper die bonding between image sensor 120 and spacer wafer 117, bond strength may be inadequate. Downstream manufacturing remedies may be relied upon, such as providing a back seal with glue, in which glue is added outside the junction of sensor package 123 and optics component 110 after die bonding, for example. However, these remedies may be costly or less reliable than desired.

Figure 3:
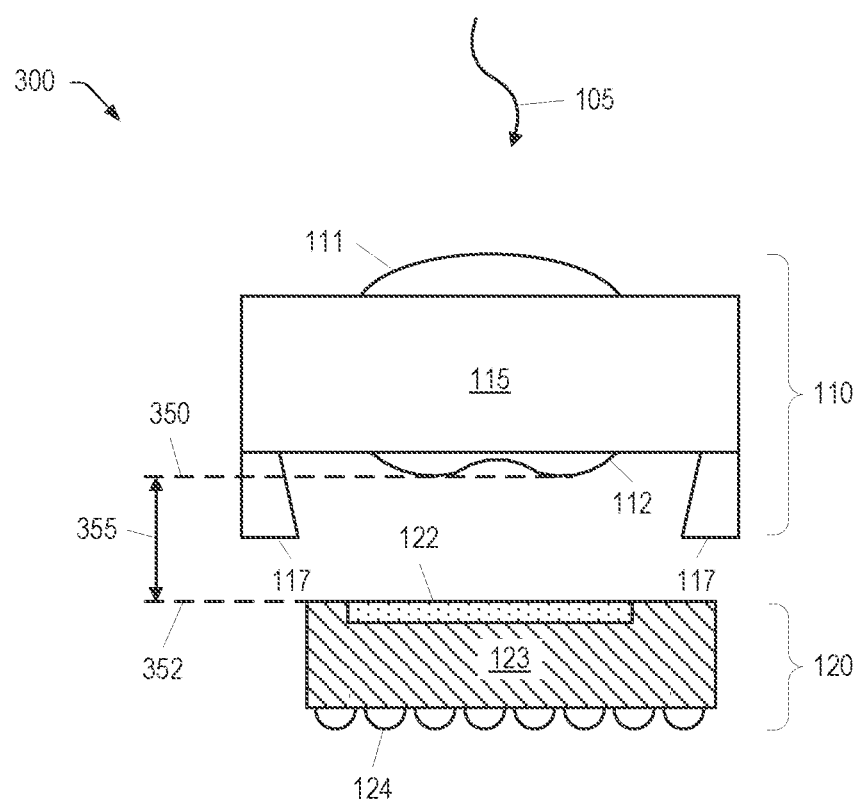
FIG. 3 is a schematic diagram showing components of the wafer-level camera of FIG. 2.

FIG. 3 is a schematic diagram showing components of a wafer-level camera 300, which is an example of wafer-level camera 200, FIG. 2. Identical items shown in FIGS. 2 and 3 are enumerated with identical reference numerals. Accordingly, their description is not repeated. FIG. 3 shows a back focal length 355, which is a distance between a lens bottom surface 350 and an image plane 352 located at the top of pixel array 122. Back focal length 355 is adjusted to focus light passing through first and second lenses 111, 112 onto pixel array 122. Adjustability of back focal length 355 enables a variety of different types of optics components, such as optics component 110, to achieve proper focus with a variety of different image sensors, such as image sensor 120, providing versatile chip-scale camera packaging. FIG. 3 shows an exemplary back focal length 355 that requires a certain distance between sensor package 123 and spacer wafer 117.

Figure 12:
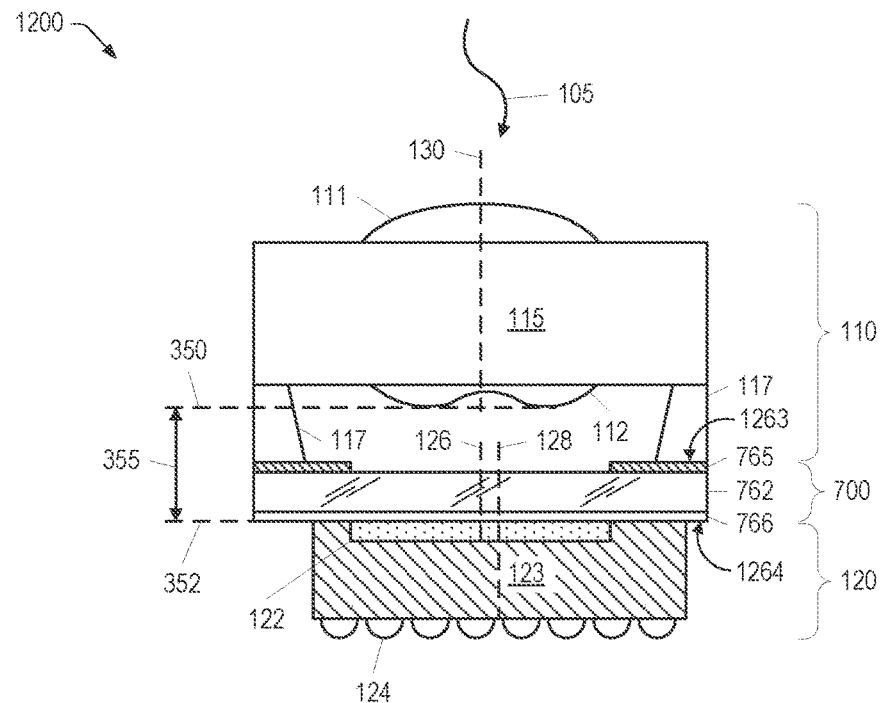
FIG. 12 is a schematic diagram showing a wafer-level camera, in an embodiment.
Figure 13:
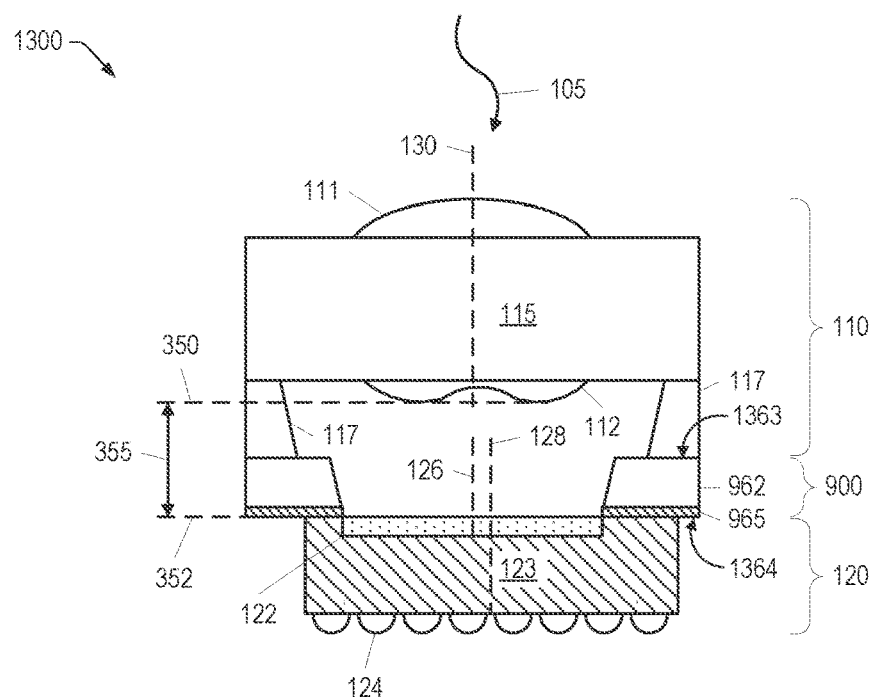
FIG. 13 is a schematic diagram showing another wafer-level camera, in an embodiment.

Wafer-level cameras 100, 200, 300 each include optics component 110 and image sensor 120, which are examples of optics components and image sensors that are typically made separately and then assembled together. Manufacturing constraints of optics component 110 and image sensor 120 often cause assembly problems such as misalignment (e.g., alignment difference 127) or a dimension mismatch (e.g., sensor package 123 is smaller than optics component 110 resulting in gap 245). Further more, to reduce costs of producing image sensor 120, a smaller sensor package 123 may be produced, reducing available surface area for wafer-level die bonding. Embodiments of interposers used to solve these problems are shown in FIGS. 4-14 and described below. Embodiments of chip-scale packaging processes, such as processes 1900, 2000, 2100, 2200 in FIGS. 19-22, use interposers, such as the interposers shown in FIGS. 4-14, to align optics component 110 with image sensor 120 and to provide sufficient overlap for die bonding together. As a result, fully integrated chip-scale package wafer-level cameras, such as wafer-level cameras 1200 and 1300 of FIGS. 12 and 13 are provided with small footprints and low profiles enabling their use in compact devices.

Figure 4:
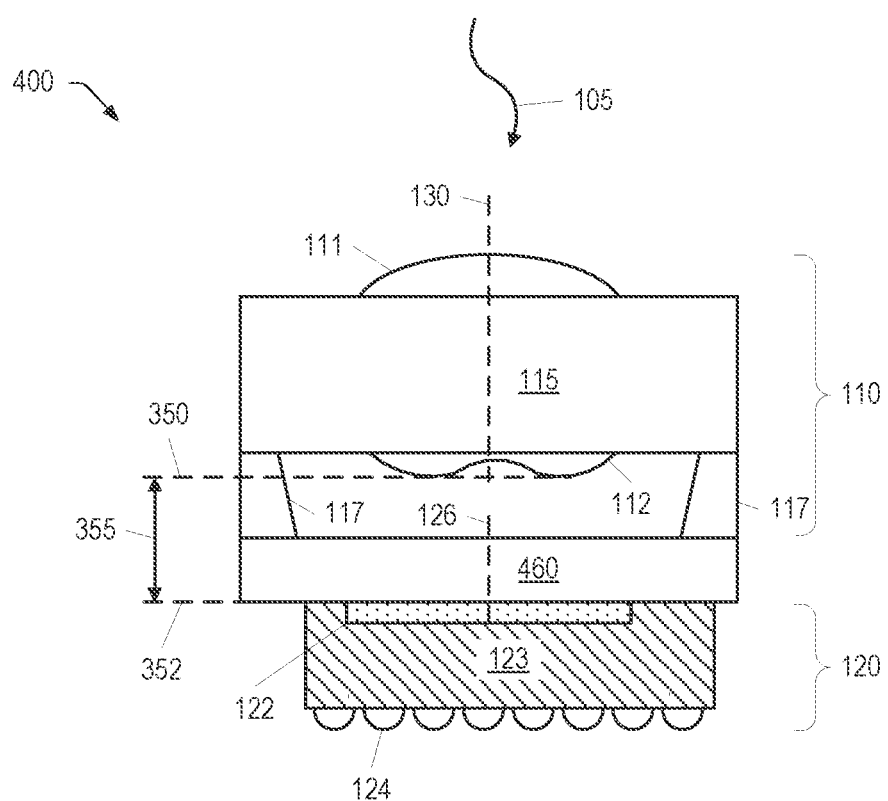
FIG. 4 is a schematic diagram showing a wafer-level camera with an interposer, in an embodiment.

FIG. 4 is a schematic diagram showing wafer-level camera 400, which is an example of wafer-level camera 300 of FIG. 3, with an interposer 460. Identical items shown in FIGS. 3 and 4 are enumerated with identical reference numerals. Accordingly, their description is not repeated. Interposer 460 provides the desired distance between optics component 110 and image sensor 120 to produce back focal length 355. Fine focus adjustments of wafer-level camera 400 may be made by adjusting back focal length 355 with a thin layer of glue applied to interposer 460 prior to bonding with optics component 110, based on optical properties of optics component 110. The thin layer of glue may optionally include ball or rod spacers of about 5 to 20 µm diameter for example. Image sensor 120 includes for example a glass coverslip to cover pixel array 122 that also contributes to back focal length 355. Interposer 460 also provides sufficient surface area for die bonding between optics component 110 and image sensor 120, thus overcoming the problem of gap 245 of FIG. 2. Interposer 460 includes a transparent portion made of glass for example, and may include optional features such as a photoresist pattern or an optical coating as shown in FIGS. 5-13.

Figure 5:
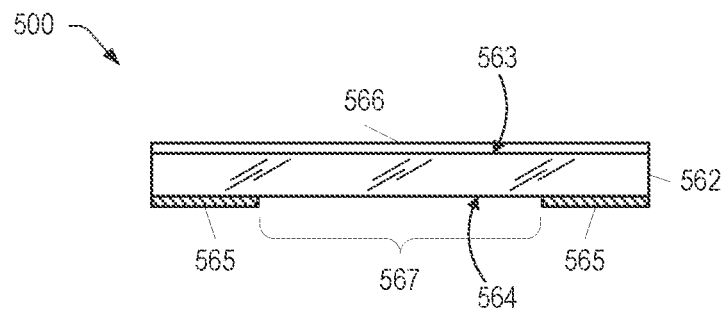
FIG. 5 shows a cross-sectional view of a first interposer, which is an example of the interposer of FIG. 4.

FIG. 5 shows a cross-sectional view of a first interposer 500, which is an example of interposer 460, FIG. 4. First interposer 500 includes a transparent portion 562, a photoresist pattern 565 disposed on a bottom surface 564 of transparent portion 562, and an optical coating 566 disposed on a top surface 563 of transparent portion 562. Transparent portion 562 is made of transparent material such as glass for example. A height of transparent portion 562 depends on the desired back focal length 355 to focus light on pixel array 122, as shown in FIG. 4. Photoresist pattern 565 is made for example of a black or chrome photoresist coating such as a solid mask, a dry film, or an epoxy glue containing metal. Photoresist pattern 565 is disposed on transparent portion 562 using for example photolithography, glue replication, etching, sputtering, or plate patterning, leaving portions without photoresist coating that form a transparent region 567. Optical coating 566 is for example an ultraviolet/infrared (UV/IR), infrared-pass-filter (IRPF) or antireflective (AR) coating. Using first interposer 500 with optical coating 566 simplifies manufacture of optics component 110 and improves optical performance compared to disposing an optical coating directly on first lens 111 or second lens 112, FIG. 4.

Figure 6:
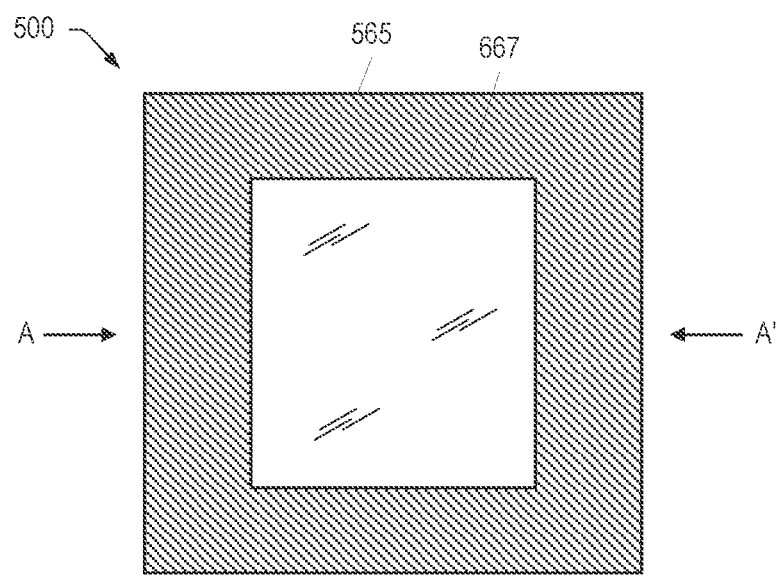
FIG. 6 shows a top-down view of the first interposer of FIG. 5.

FIG. 6 shows a top-down view of first interposer 500, FIG. 5. Line A-A' in FIG. 6 indicates the location of the cross-section of FIG. 5. Photoresist pattern 565 is disposed such that a rectangular transparent region 667 remains without photoresist allowing light to selectively pass. First interposer 500 may be preferentially used for die bonding to image sensor 120 such that rectangular transparent region 667 matches the size and shape of pixel array 122 of FIG. 4 for example. An arbitrary two-dimensional photoresist pattern may be disposed for an entire interposer wafer prior to dicing (see e.g., FIGS. 15, 16).

Figure 7:
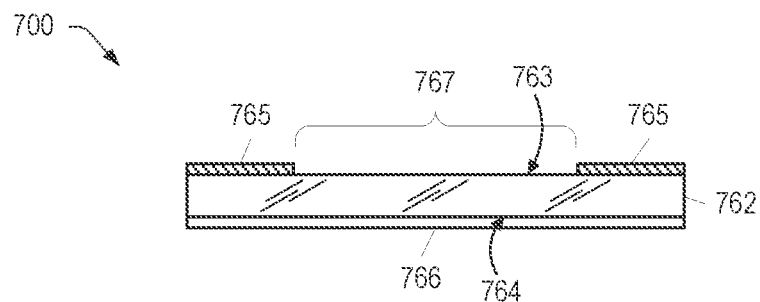
FIG. 7 shows a cross-sectional view of a second interposer, in an embodiment.

FIG. 7 shows a cross-sectional view of a second interposer 700, which is another example of interposer 460, FIG. 4. Second interposer 700 includes a photoresist pattern 765 disposed on a top surface 763 and an optical coating 766 disposed on a bottom surface 764 of a transparent portion 762. Photoresist pattern 765 is disposed such that portions without photoresist coating form a transparent region 767 to selectively allow light to pass. FIG. 12 shows second interposer 700 integrated with optics component 110 and image sensor 120.

Figure 8:
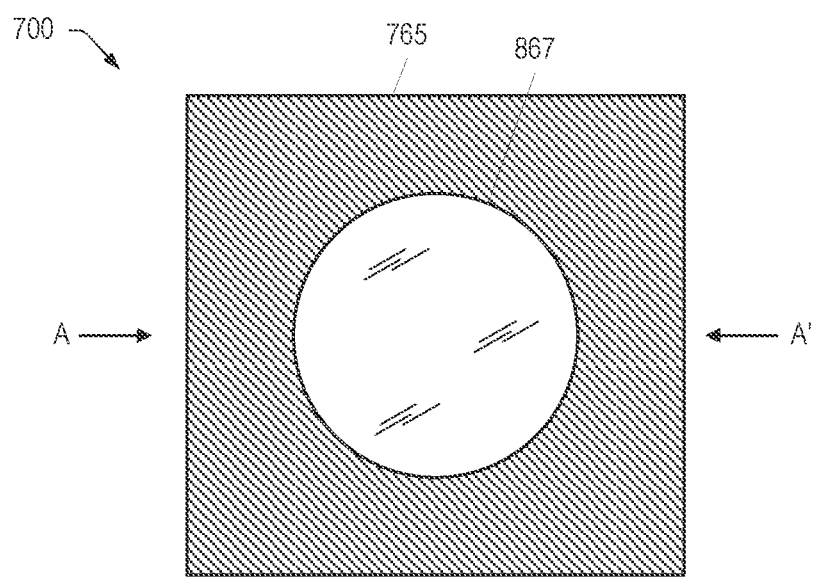
FIG. 8 shows a top-down view of the second interposer of FIG. 7.

FIG. 8 shows a top-down view of second interposer 700, FIG. 7. Line A-A' in FIG. 8 indicates the location of the cross-section of FIG. 7. Photoresist pattern 765 is disposed such that a circular transparent region 867 remains uncoated to allow light to pass. Second interposer 700 may be preferentially used for die bonding to optics component 110 such that circular transparent region 867 matches the shape of first and second lenses 111, 112 of FIG. 4, for example.

Figure 9:
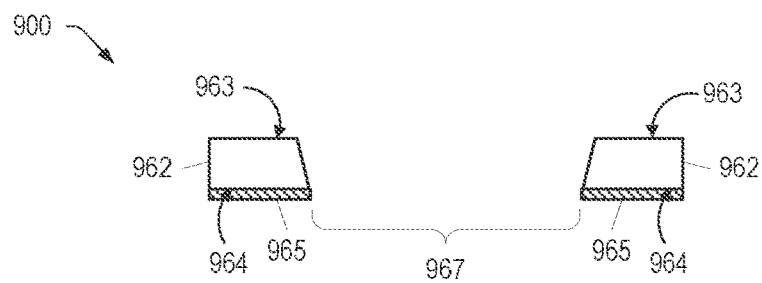
FIG. 9 shows a cross-sectional view of a third interposer, in an embodiment.

FIG. 9 shows a cross-sectional view of a third interposer 900, which is an example of interposer 460, FIG. 4. Third interposer 900 includes a hole 967 that allows light to pass between outer portions 962 having a photoresist pattern 965 disposed on a bottom surface 964 opposite a top surface 963. Hole 967 is formed using for example a laser drill, sand blaster or etching process. FIG. 13 shows third interposer 900 integrated with optics component 110 and image sensor 120.

Figure 10:
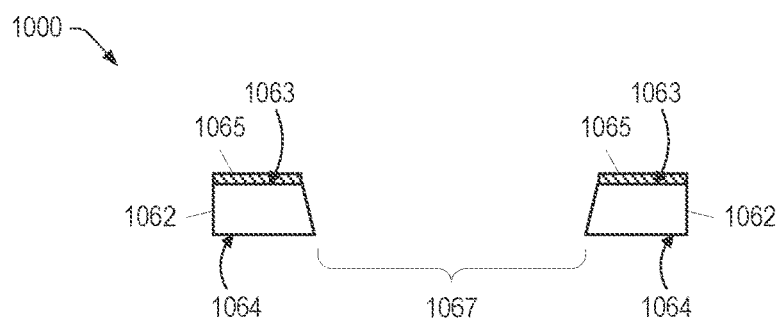
FIG. 10 shows a cross-sectional view of a fourth interposer, in an embodiment.

FIG. 10 shows a cross-sectional view of a fourth interposer 1000, which is an example of interposer 460, FIG. 4. Fourth interposer 1000 includes a hole 1067 that allows light to pass between outer portions 1062 having a photoresist pattern 1065 disposed on a top surface 1063 opposite a bottom surface 1064.

Figure 11:
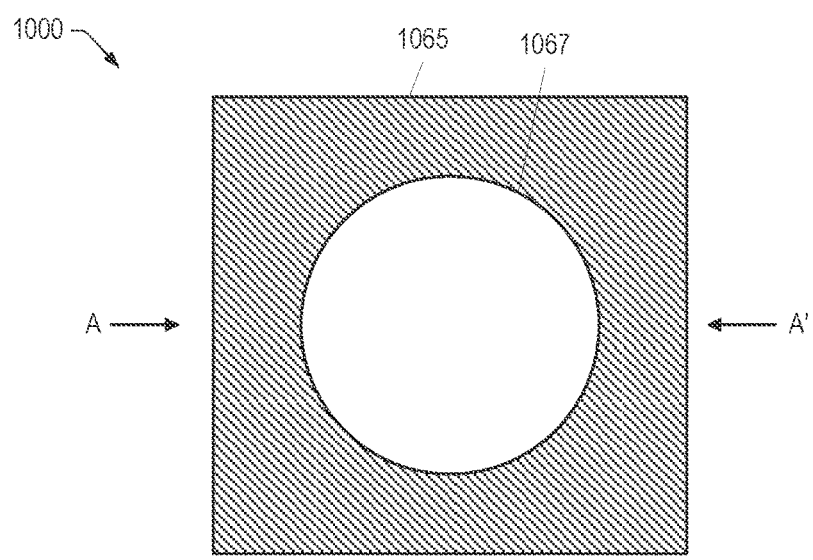
FIG. 11 shows a top-down view of the fourth interposer of FIG. 10.

FIG. 11 shows a top-down view of fourth interposer 1000 of FIG. 10, revealing hole 1067. Line A-A' in FIG. 11 indicates the location of the cross-section of FIG. 10. Hole 1067 is formed through interposer 1000 to allow light to pass through photoresist pattern 1065.

FIG. 12 is a schematic diagram showing wafer-level camera 1200, which is an example of wafer-level camera 400 of FIG. 4. FIG. 12 shows second interposer 700, FIG. 7 integrated with optics component 110 and image sensor 120. Identical items shown in FIGS. 4, 7 and 12 are enumerated with identical reference numerals. Accordingly, their description is not repeated. Second interposer 700 provides proper spacing between optics component 110 and image sensor 120 for back focal length 355 to focus light 105 on pixel array 122. Second interposer 700 also provides alignment of optical center 130 and pixel array center 126. Photoresist pattern 765 is used in chip-scale packaging processes, such as processes 1900, 2000, 2100, 2200 in FIGS. 19-22, to align optical center 130 and pixel array center 126 despite a misaligned sensor package center 128. Second interposer 700 also alleviates insufficient overlap (e.g., gap 245, FIG. 2) for die bonding optics component 110 together with image sensor 120.

FIG. 13 is a schematic diagram showing wafer-level camera 1300, which is an example of wafer-level camera 400 of FIG. 4. FIG. 13 shows third interposer 900, FIG. 9 integrated with optics component 110 and image sensor 120. Identical items shown in FIGS. 4 and 13 are enumerated with identical reference numerals. Accordingly, their description is not repeated. Third interposer 900 provides proper spacing between optics component 110 and image sensor 120 for back focal length 355 to focus light 105 on pixel array 122. Photoresist pattern 965 is used in chip-scale packaging processes, such as processes 1900, 2000, 2100, 2200 in FIGS. 19-22, to align optical center 130 and pixel array center 126 despite a misaligned sensor package center 128. Third interposer 900 also alleviates insufficient overlap (e.g., gap 245, FIG. 2) for die bonding optics component 110 together with image sensor 120.

Figure 14:
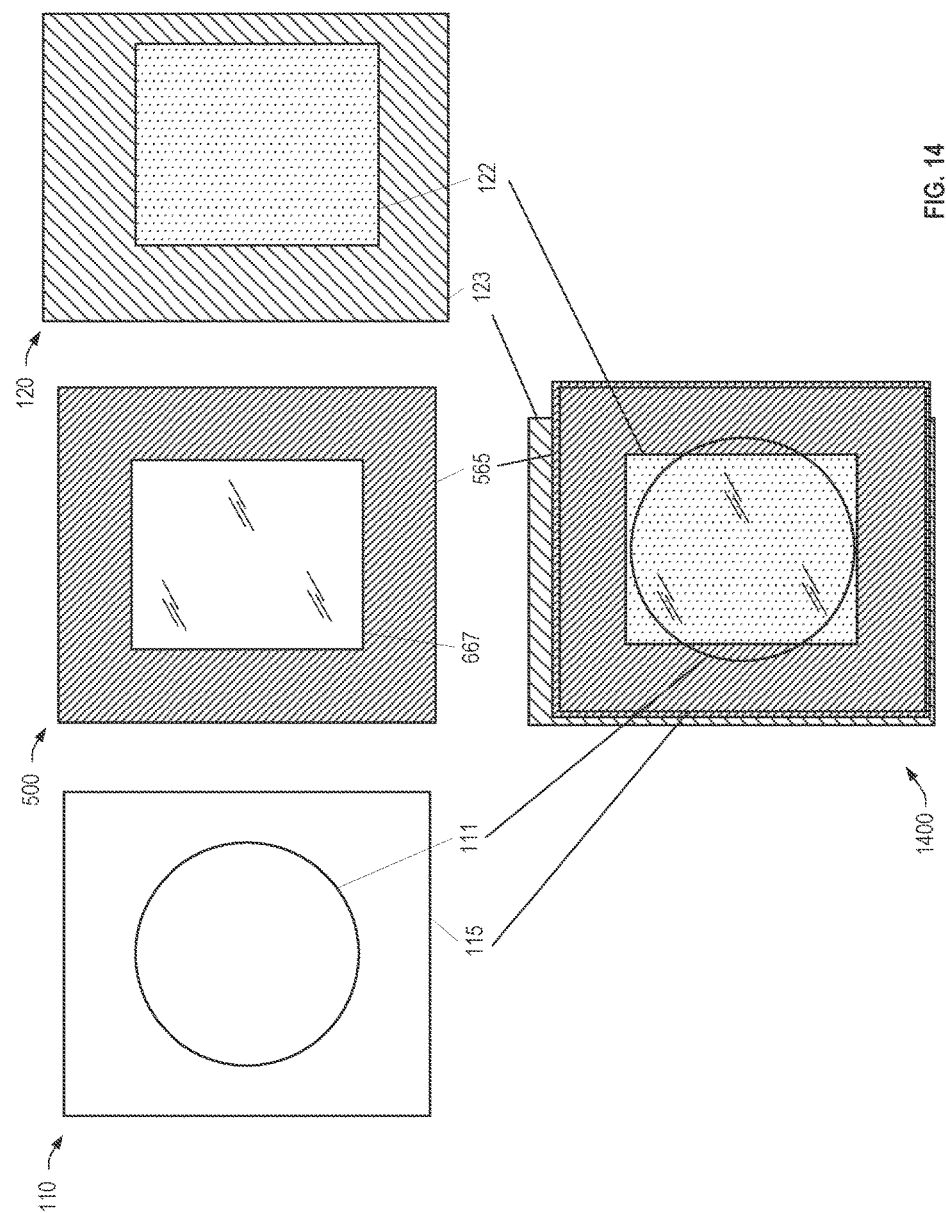
FIG. 14 shows a top-down view of wafer-level camera components, including an optics component, an image sensor and an interposer, both separately and stacked together, in an embodiment.

FIG. 14 shows a top-down view of wafer-level camera components, including optics component 110 of FIG. 4, first interposer 500 of FIGS. 5 and 6, and image sensor 120 of FIG. 4. FIG. 14 also shows a top-down view of optics component 110, first interposer 500, and image sensor 120 stacked together to form a wafer-level camera 1400. Optics component 110 includes first lens 111 and lens package 115. First interposer 500 includes a photoresist pattern 565 and a rectangular transparent region 667. Image sensor 120 includes pixel array 122 and sensor package 123.

Wafer-level camera 1400 includes optics component 110 located above first interposer 500, which is located above image sensor 120. Wafer-level camera 1400 includes for example first lens 111 aligned above rectangular transparent region 667, which is aligned above pixel array 122.

Figure 15:
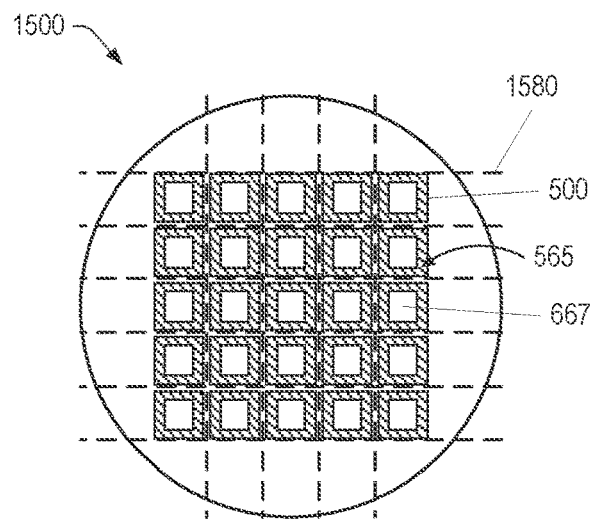
FIG. 15 shows an interposer wafer prior to dicing along dice lines to form a plurality of interposers, in an embodiment.

FIGS. 15-18 show exemplary wafers containing a plurality of wafer-level components prior to dicing. Specifically, FIG. 15 shows an exemplary interposer wafer 1500 prior to dicing along dice lines 1580 to form a plurality first interposers 500 of FIGS. 5 and 6, having a photoresist pattern 565 and a plurality of rectangular transparent regions 667.

Figure 16:
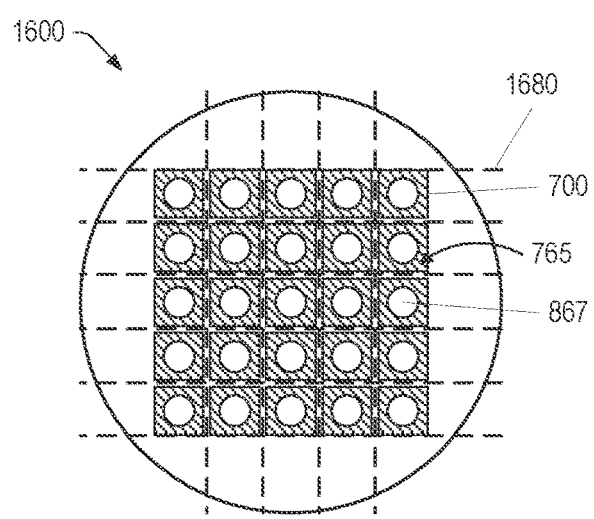
FIG. 16 shows another interposer wafer, which is an example of the interposer wafer of FIG. 15.

FIG. 16 shows another exemplary interposer wafer 1600 prior to dicing along dice lines 1680 to form a plurality of second interposers 700 of FIGS. 7 and 8, having photoresist pattern 765 and a plurality of circular transparent regions 867. In an embodiment, a hole may be formed through interposer wafer 1600 in the locations of the circular transparent regions 1667.

Figure 17:
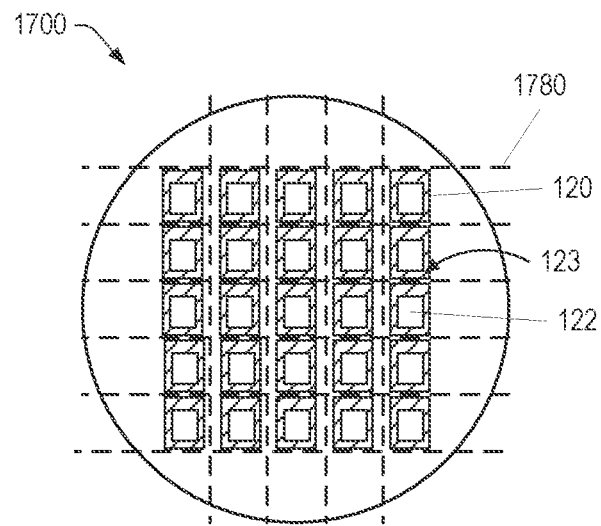
FIG. 17 shows an image sensor wafer prior to dicing along dice lines to form a plurality of image sensors, in an embodiment.

FIG. 17 shows an exemplary image sensor wafer 1700 prior to dicing along dice lines 1780 to form a plurality of image sensors 120 of FIGS. 1 and 14 having pixel arrays 122 and sensor packages 123.

Figure 18:
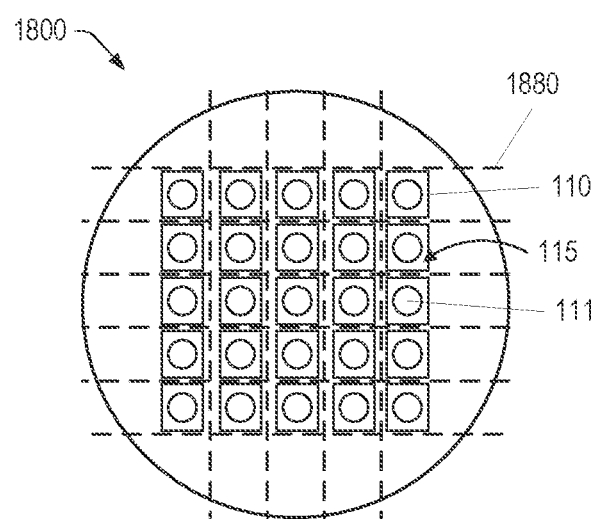
FIG. 18 shows an optics component wafer prior to dicing along dice lines to form a plurality of optics components, in an embodiment.

FIG. 18 shows an exemplary optics component wafer 1800 prior to dicing along dice lines 1880 to form a plurality of optics components 110 of FIGS. 1 and 14 having first lenses 111 and lens packages 115.

Photoresist pattern 565, FIG. 15 and photoresist pattern 665, FIG. 16 may be designed for die bonding with an image sensor wafer 1700, FIG. 17 or an optics component wafer 1800, FIG. 18, depending on a chip-scale packaging process, such as process 1900, 2000, 2100, or 2200, FIGS. 19-22. For example, photoresist pattern 565 has rectangular transparent regions 667 designed to match pixel arrays 122, FIG. 17. Similarly, photoresist pattern 765 has circular transparent regions 867 designed to match first lenses 111, FIG. 18.

Either of interposer wafers 1500, 1600 may be stacked between optics component wafer 1800 and image sensor wafer 1700 depending on the packaging process. Dicing of the wafers may be performed following bonding of image sensor wafer 1700, interposer wafer 1500 or 1600, and optics component wafer 1800. Alternatively, dicing of the wafers may be performed following bonding of either image sensor wafer 1700 or optics component wafer 1800 with interposer wafer 1500 or 1600. Finally, each wafer may be separately diced prior to bonding without departing from the scope hereof. FIGS. 19-22 show exemplary wafer-level camera chip-scale packaging processes 1900, 2000, 2100, 2200, respectively.

Figure 19:
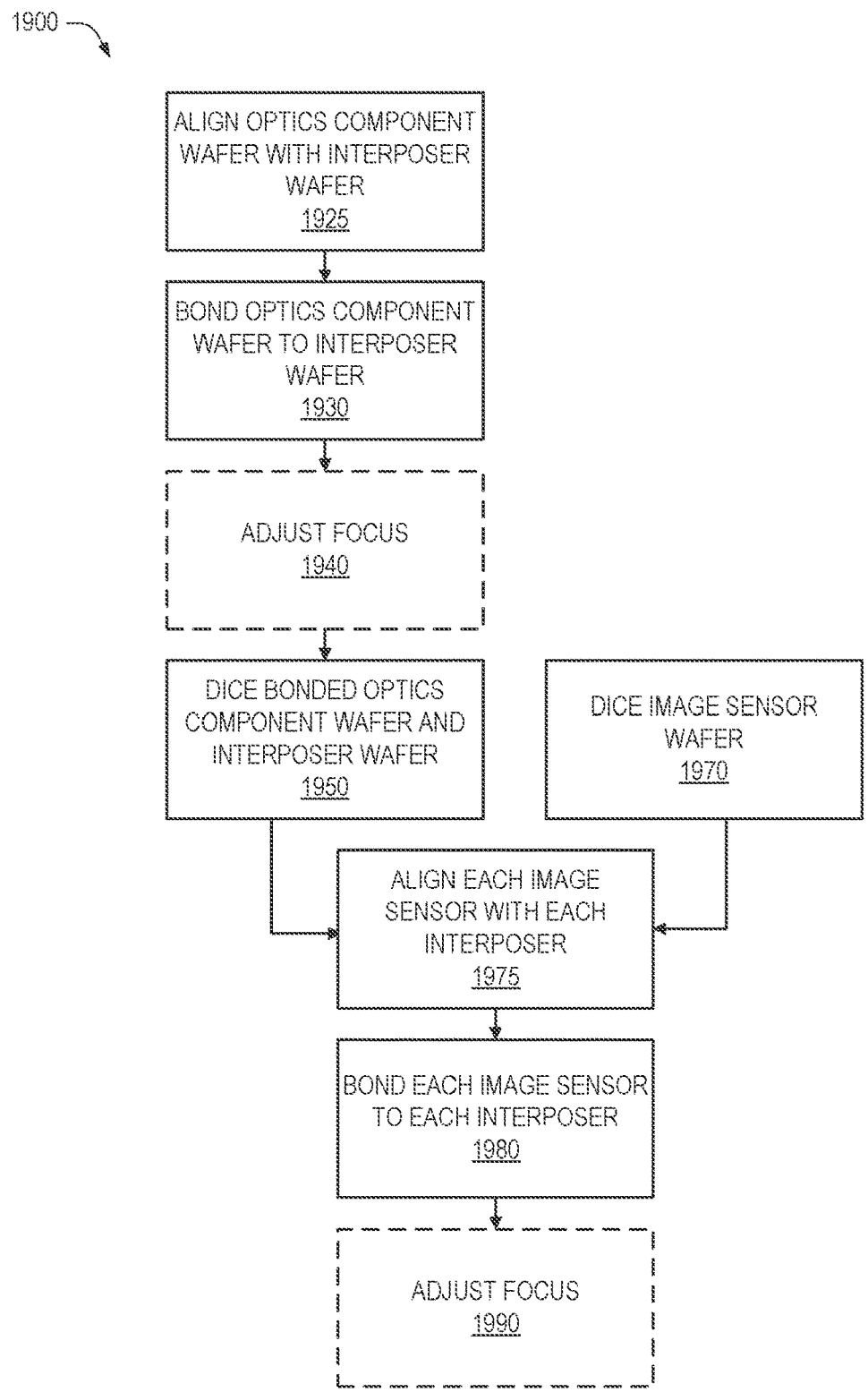
FIG. 19 is a flow diagram showing one embodiment of a chip-scale packaging process for wafer-level camera manufacture.

FIG. 19 is a flow diagram showing an exemplary chip-scale packaging process 1900 for wafer-level camera manufacture. Process 1900 is used to manufacture for example wafer-level camera 1200, FIG. 12.

In a step 1925, an optics component wafer is aligned with an interposer wafer. In an example of step 1925, optics component wafer 1800, FIG. 18 is aligned with interposer wafer 1600, FIG. 16 based on photoresist pattern 765.

In a step 1930, the optics component wafer is bonded to the interposer wafer. In an example of step 1930, optics component wafer 1800 is die bonded to interposer wafer 1600.

In an optional step 1940, fine wafer-level camera focus is adjusted. In an example of step 1940, a thin layer of glue is added between interposer wafer 1600 and optics component wafer 1800 to adjust back focal distance 355 based on optical properties of optics component wafer 1800. The optical properties may for example be tested during manufacture such that adjustments to back focal distance 355 may be made for each optics component wafer 1800. If optional step 1940 is not performed, fine wafer-level camera focus may be adjusted in optional step 1990 as described below.

In a step 1950, the bonded optics component wafer and interposer wafer are diced. In an example of step 1950, optics component wafer 1800 is die bonded to interposer wafer 1600, and the bonded wafers are diced to form a plurality of bonded optics components with interposers.

In a step 1970, an image sensor wafer is diced to form a plurality of image sensors. In an example of step 1970, image sensor wafer 1700, FIG. 17 is diced along dice lines 1780 to form a plurality of image sensors 120.

In a step 1975, each image sensor is aligned with each interposer. In an example of step 1975, each pixel array 122 of image sensor 120 is aligned with second interposer 700, FIG. 12 based on photoresist pattern 765 prior to bonding.

In a step 1980, each image sensor is bonded to a second side of each interposer to form a wafer-level camera. In an example of step 1980, image sensor 120 is bonded to the second side 1264 of second interposer 700, FIG. 12.

In an optional step 1990, fine camera focus is adjusted. In an example of step 1990, a thin layer of glue is added between second interposer 700, FIG. 12 and optics component 110 to adjust a back focal length 355 based on optical properties of first lens 111 and second lens 112. The optical properties of each optics component 110 may for example be tested during manufacture such that adjustments to back focal length 355 may be made for each optics component 110. Optional step 1990 may not be performed if fine camera focus was previously adjusted in optional step 1940, as described above.

Figure 20:
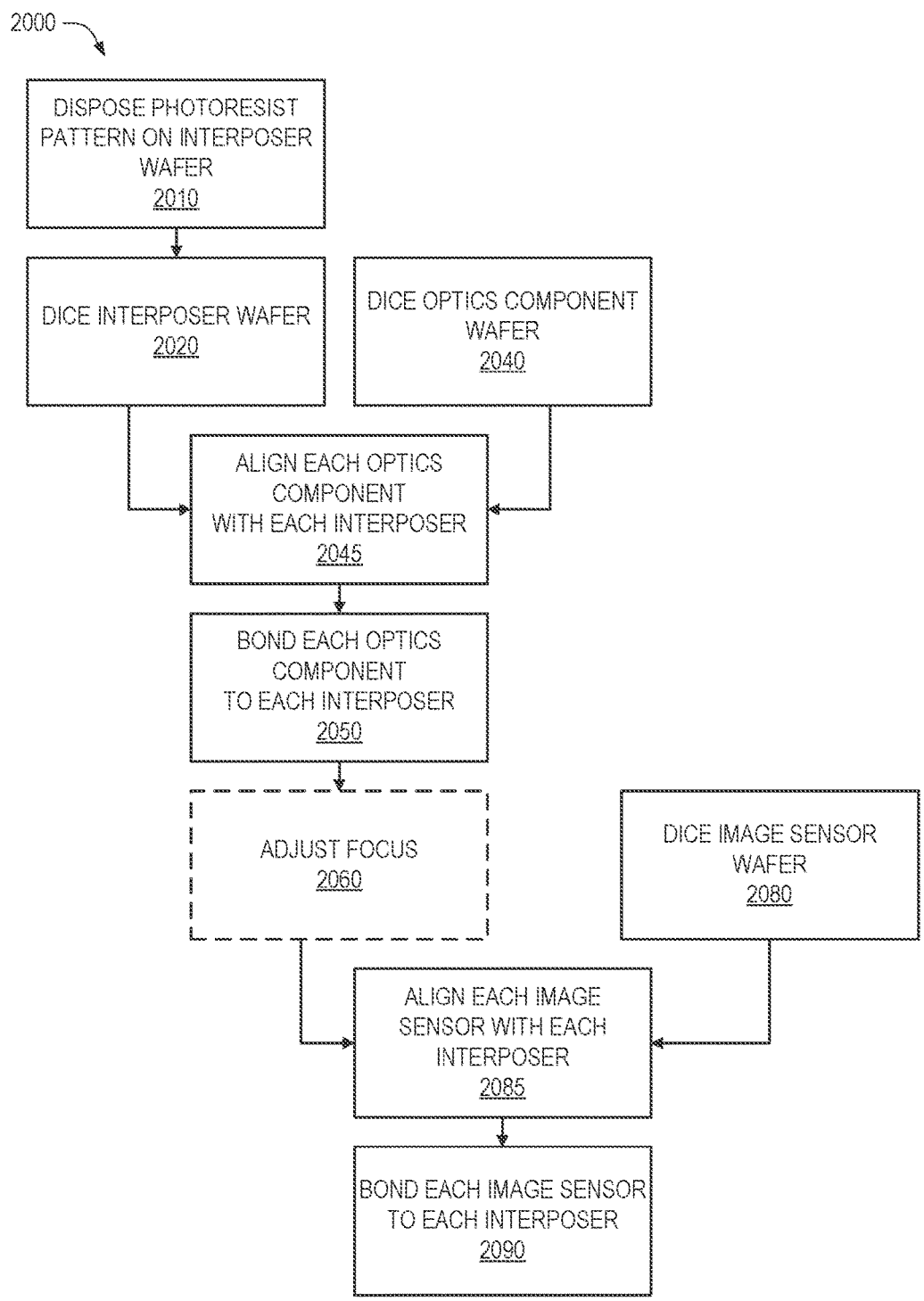
FIG. 20 is a flow diagram showing another embodiment of a chip-scale packaging process for wafer-level camera manufacture.

FIG. 20 is a flow diagram showing another exemplary chip-scale packaging process 2000 for wafer-level camera manufacture. Process 2000 is used to manufacture for example wafer-level camera 1200, FIG. 12.

In a step 2010, a photoresist pattern is disposed on an interposer wafer. In an example of step 2010, photoresist pattern 765 is disposed on a first side of interposer wafer 1600, FIG. 16 to form a plurality of transparent regions 867.

In a step 2020, the interposer wafer is diced. In an example of step 2020, interposer wafer 1600, FIG. 16 is diced along dice lines 1680 into a plurality of second interposers 700.

In a step 2040, an optics component wafer is diced. In an example of step 2040, optics component wafer 1800, FIG. 18 is diced along dice lines 1880 into a plurality of optics components 110.

In a step 2045, each optics component is aligned with each interposer. In an example of step 2045, each optics component 110 is aligned with each second interposer 700, FIG. 12 based on photoresist pattern 765.

In a step 2050, each optics component is bonded to each interposer. In an example of step 2050, each optics component 110, FIG. 12 is die bonded to a first side 1263 of each second interposer 700, FIG. 12.

In an optional step 2060, fine wafer-level camera focus is adjusted. In an example of step 2060, a thin layer of glue is added between second interposer 700, FIG. 12 and optics component 110, to adjust a back focal length 355 based on optical properties of first lens 111 and second lens 112. The optical properties may for example be tested during manufacture such that adjustments to back focal length 355 may be made for each optics component 110.

In a step 2080, an image wafer is diced. In an example of step 2080, image sensor wafer 1700, FIG. 17 is diced into a plurality of image sensors, such as image sensor 120, FIG. 12.

In a step 2085, each image sensor is aligned with each interposer. In an example of step 2085, image sensor 120 is aligned with second interposer 700, FIG. 12 based on photoresist pattern 765.

In a step 2090, each image sensor is bonded to each interposer. In an example of step 2090, image sensor 120 is die bonded to a second side 1264 of second interposer 700, FIG. 12.

Figure 21:
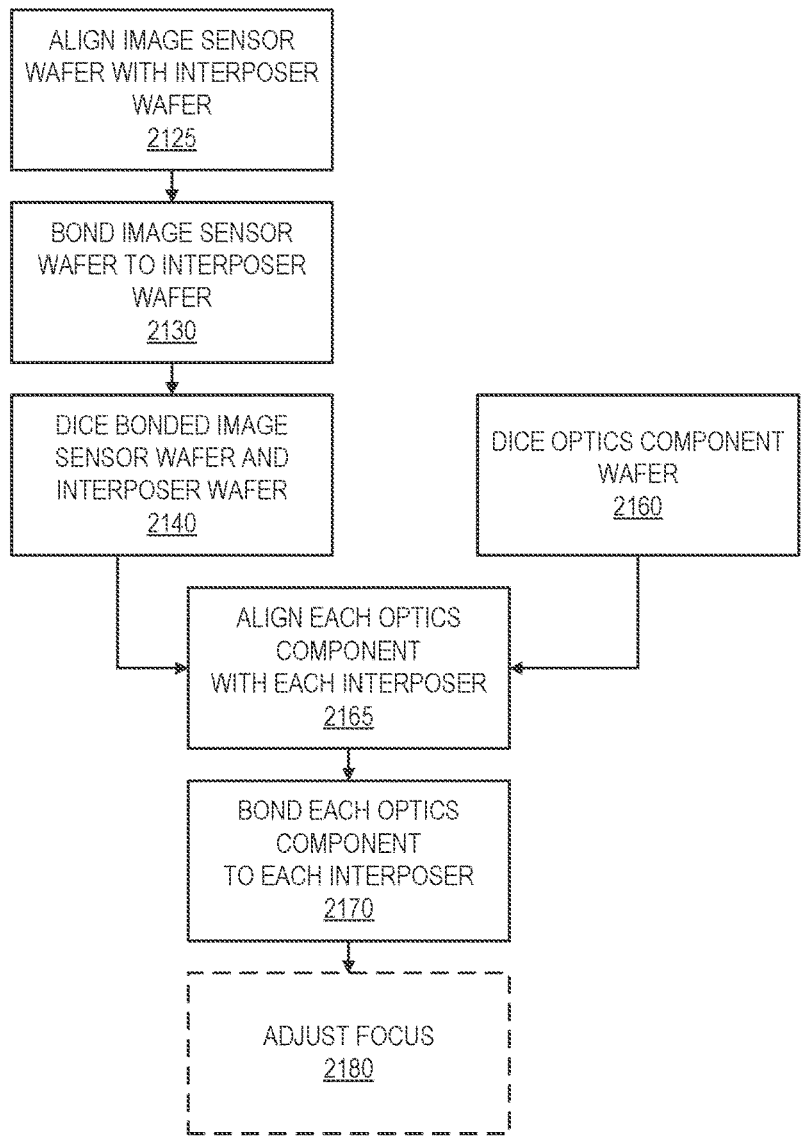
FIG. 21 is a flow diagram showing another embodiment of a chip-scale packaging process for wafer-level camera manufacture.

FIG. 21 is a flow diagram showing another exemplary chip-scale packaging process 2100 for wafer-level camera manufacture. Process 2100 is used to manufacture for example wafer-level camera 1300, FIG. 13.

In a step 2125, an image sensor wafer is aligned with an interposer wafer. In an example of step 2125, image sensor wafer 1700, FIG. 17 is aligned with interposer wafer 1500, FIG. 15 based on photoresist pattern 565. In another example of step 2125, image sensor wafer 1700, FIG. 17 is aligned with interposer wafer 1600, FIG. 16 based on photoresist pattern 765.

In a step 2130, the image sensor wafer is bonded to the interposer wafer. In an example of step 2130, image sensor wafer 1700, FIG. 17 is die bonded to interposer wafer 1500, FIG. 15.

In a step 2140, the bonded image sensor wafer and interposer wafer is diced. In an example of step 2140, the bonded image sensor wafer 1700 and interposer wafer 1500 is diced.

In a step 2160, an optics component wafer is diced. In an example of step 2150, optics component wafer 1800, FIG. 18 is diced along dice lines 1880 to provide a plurality of optics components 110.

In a step 2165, each optics component is aligned with each interposer. In an example of step 2165, optics component 110 is aligned with third interposer 900, FIG. 13 based on photoresist pattern 965.

In a step 2170, each optics component is bonded to each interposer. In an example of step 2170, optics component 110 is bonded to first side 1363 of third interposer 900, FIG. 13.

In an optional step 2180, fine camera focus is adjusted. In an example of step 2180, a thin layer of glue is added between third interposer 900, FIG. 13 and optics component 110, to adjust a back focal length 355 based on optical properties of first lens 111 and second lens 112. The optical properties may for example be tested during manufacture such that adjustments to back focal length 355 may be made for each optics component 110.

Figure 22:
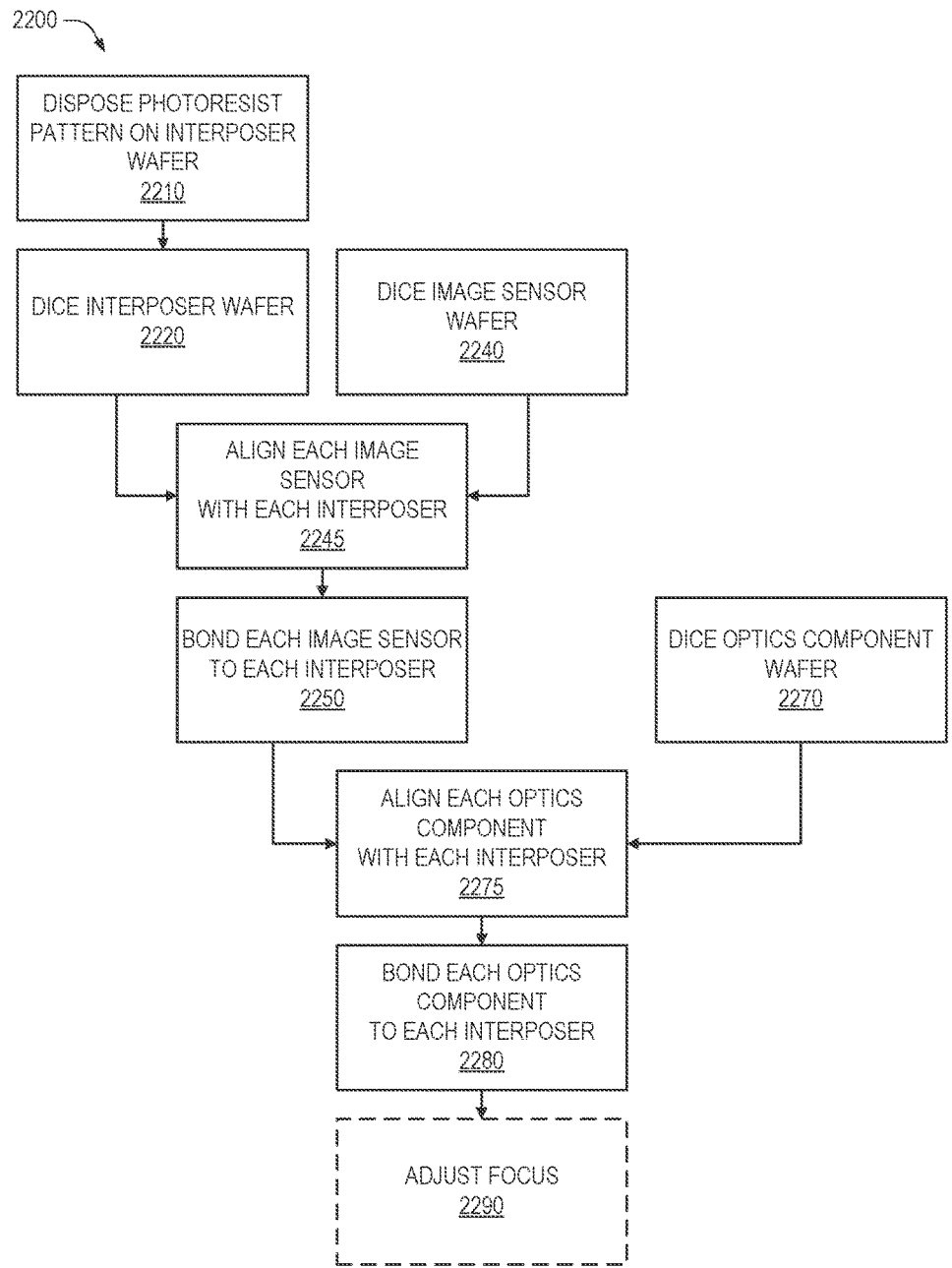
FIG. 22 is a flow diagram showing another embodiment of a chip-scale packaging process for wafer-level camera manufacture.

FIG. 22 is a flow diagram showing another exemplary chip-scale packaging process 2200 for wafer-level camera manufacture. Process 2200 is used to manufacture for example wafer-level camera 1300, FIG. 13.

In a step 2210, a photoresist pattern is disposed on an interposer wafer. In an example of step 2210, photoresist pattern 565 is disposed on interposer wafer 1500, FIG. 15 to form a plurality of transparent regions 667.

In a step 2220, an interposer wafer is diced. In an example of step 2220, interposer wafer 1500, FIG. 15 is diced along dice lines 1580 to form a plurality of first interposers 500.

In a step 2240, an image sensor wafer is diced. In an example of step 2240, image sensor wafer 1700, FIG. 17 is diced along dice lines 1780 to form a plurality of image sensors 120.

In a step 2245, each image sensor is aligned with each interposer. In an example of step 2245, image sensor 120 is aligned with third interposer 900, FIG. 13 based on photoresist pattern 965.

In a step 2250, each image sensor is bonded to each interposer. In an example of step 2250, image sensor 120 is die bonded to a second side 1364 of third interposer 900, FIG. 13.

In a step 2270, an optics component wafer is diced. In an example of step 2270, optics component wafer 1800, FIG. 18 is diced along dice lines 1880 to form a plurality of optics components 110.

In a step 2275, each optics component is aligned with each interposer. In an example of step 2275, optics component 110 is aligned with third interposer 900, FIG. 13 based on photoresist pattern 965.

In a step 2280, each optics component is bonded to each interposer. In an example of step 2280, optics component 110 is bonded to a first side 1363 of third interposer 900, FIG. 13.

In an optional step 2290, fine wafer-level camera focus is adjusted. In an example of step 2290, a thin layer of glue is added between third interposer 900, FIG. 13 and optics component 110, to adjust a back focal length 355 based on optical properties of first lens 111 and second lens 112. The optical properties may for example be tested during manufacture such that adjustments to back focal length 355 may be made for each optics component 110.

Features described above as well as those claimed below may be combined in various ways without departing from the scope hereof. The following examples illustrate some possible, non-limiting combinations:

(A1) A chip-scale packaging process for wafer-level camera manufacture may include aligning an optics component wafer with an interposer wafer based on a photoresist pattern disposed on a first side of the interposer wafer, bonding the aligned optics component wafer to the first side of the interposer wafer, and dicing the bonded optics component wafer and interposer wafer into a plurality of optics components with interposers, such that each optics component with interposer includes a transparent region formed by the photoresist pattern. The process may further include dicing an image sensor wafer into a plurality of image sensors, wherein each of the plurality of image sensors has a pixel array, aligning the pixel array of each of the plurality of image sensors with a respective one of the plurality of optics components with interposers based on the transparent region of the optics component with interposer, and bonding each of the plurality of image sensors to its respective one of the plurality of optics components with interposers, thereby forming a plurality of wafer-level cameras.

(A2) The process denoted as (A1) may further include aligning the photoresist pattern to match a plurality of lenses of the optics component wafer.

(A3) The process denoted as (A1) or (A2) may further include aligning the optics component wafer with the interposer wafer to provide overlap for die bonding together.

(A4) The process denoted as (A1) through (A3) may further include disposing an optical coating on a second side of the interposer wafer, the second side being opposite of the first side.

(A5) The process denoted as (A1) through (A4) may further include forming a plurality of holes through the interposer wafer based on the photoresist pattern.

(A6) The process denoted as (A1) through (A5) may further include adjusting fine camera focus by applying a thin layer of glue between the optics component wafer and the interposer wafer to adjust a back focal distance based on optical properties of the optics component wafer.

(A7) The process denoted as (A1) through (A6) may further include adjusting fine camera focus by applying a thin layer of glue between each of the plurality of image sensors and its respective optics component with interposer to adjust a back focal distance based on optical properties of the optics component with interposer.

(B1) A chip-scale packaging process for wafer-level camera manufacture may include aligning an image sensor wafer with an interposer wafer such that a plurality of image sensor pixel arrays of the image sensor wafer are aligned with a plurality of transparent regions formed by a photoresist pattern disposed on a first side of interposer wafer, bonding the aligned image sensor wafer to the first side of the interposer wafer, and dicing the bonded image sensor wafer and interposer wafer into a plurality of image sensors with interposers, such that each image sensor with interposer includes a respective one of the plurality of transparent regions. The process may further include dicing an optics component wafer into a plurality of optics components, aligning each of the plurality of optics components with a respective one of the plurality of image sensors with interposers based on the transparent region of the respective image sensor with interposer, and bonding each of the plurality of optics components to its respective image sensor with interposer to form a plurality of wafer-level cameras.

(B2) The process denoted as (B1) may further include each of the plurality of transparent regions being shaped for aligning with a respective pixel array of the plurality of image sensor pixel arrays.

(B3) The process denoted as (B1) or (B2) may further include aligning the image sensor wafer with the interposer wafer to provide overlap for die bonding together.

(B4) The process denoted as (B1) through (B3) may further include forming a plurality of holes through the interposer wafer based on the photoresist pattern.

(B5) The process denoted as (B1) through (B4) may further include adjusting fine camera focus by applying a thin layer of glue between each of the plurality of optics components and its respective image sensor with interposer to adjust a back focal distance based on optical properties of the optics component.

(C1) A chip-scale packaging process for wafer-level camera manufacture may include disposing a photoresist pattern on a first side of an interposer wafer to form a plurality of transparent regions, dicing the interposer wafer into a plurality of interposers such that each interposer includes a respective one of the plurality of transparent regions, and dicing an optics component wafer into a plurality of optics components, with each of the plurality of optics components having at least one lens. The process may further include dicing an image sensor wafer into a plurality of image sensors, with each of the plurality of image sensors having a pixel array, aligning each of the plurality of optics components with a respective one of the plurality of image sensors and a respective one of the plurality of interposers, based on the transparent region of the respective interposer, and bonding each of the plurality optics components and each of the plurality of image sensors to opposing respective sides of a respective one of the plurality of interposers, to form a plurality of wafer-level cameras.

(C2) The process denoted as (C1) or (C2) may further include aligning the at least one lens of each of the plurality of optics components with the transparent region of the respective one of the plurality of interposers, and aligning the pixel array of each of the plurality of image sensors with the transparent region of the respective one of the plurality of interposers.

(D1) A chip-scale package wafer-level camera may include an image sensor that includes a pixel array having a top surface and a pixel array center, and a sensor package having a sensor package center misaligned from the pixel array center. The camera may further include an optics component having a bottom lens surface and an optical center, and an interposer having a first side and an opposing second side, with the optics component being bonded to the first side and the image sensor being bonded to the second side to form the wafer-level camera; the optical center is aligned with the pixel array center, and the interposer provides a back focal length between the bottom lens surface of the optics component and the top surface of the pixel array for focusing light from the optics component onto the top surface of the pixel array.

(D2) The camera denoted as (D1) may further include a thin layer of glue between the first side of the interposer and the optics component that adjusts the back focal length.

(D3) The camera denoted as (D1) or (D2) may further include the interposer providing overlap between the optics component and the interposer for die bonding, and the interposer providing overlap between the image sensor and the interposer for die bonding.

(D4) The camera denoted as (D1) through (D3) may further include a photoresist pattern disposed on the first side to form a transparent region for aligning with the image sensor pixel array.

(D5) The camera denoted as (D1) through (D4) may further include an optical coating disposed on the second side.

(D6) The camera denoted as (D1) through (D5) may further include a hole formed through the interposer.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present methods and systems, which, as a matter of language, might be said to fall therebetween.

What is claimed is:

1. A chip-scale packaging process for wafer-level camera manufacture, comprising:
    aligning an optics component wafer with an interposer wafer based on a photoresist pattern disposed on a first side of the interposer wafer;
    forming a plurality of holes through the interposer wafer based on the photoresist pattern;
    bonding the aligned optics component wafer to the first side of the interposer wafer;
    dicing the bonded optics component wafer and interposer wafer into a plurality of optics components with interposers, such that each optics component with interposer includes a transparent region formed by the photoresist pattern;

dicing an image sensor wafer into a plurality of image sensors, wherein each of the plurality of image sensors has a pixel array;

aligning the pixel array of each of the plurality of image sensors with a respective one of the plurality of optics components with interposers based on the transparent region of the optics component with interposer; and bonding each of the plurality of image sensors to its respective one of the plurality of optics components with interposers, thereby forming a plurality of wafer-level cameras.

2. The process of claim 1, the step of aligning an optics component wafer with an interposer wafer further comprising aligning the photoresist pattern to match a plurality of lenses of the optics component wafer.

3. The process of claim 2, further comprising aligning the optics component wafer with the interposer wafer to provide overlap for die bonding together.

4. The process of claim 1, further comprising disposing an optical coating on a second side of the interposer wafer, the second side being opposite of the first side.

5. The process of claim 1, the step of bonding the optics component wafer to the first side of the interposer wafer comprising adjusting fine camera focus by applying a thin layer of glue between the optics component wafer and the interposer wafer to adjust a back focal distance based on optical properties of the optics component wafer.

6. The process of claim 1, the step of bonding each of the plurality of image sensors to its respective optics component with interposer comprising adjusting fine camera focus by applying a thin layer of glue between each of the plurality of image sensors and its respective optics component with interposer to adjust a back focal distance based on optical properties of the optics component with interposer.

7. The process of claim 1, the step of forming the plurality of holes comprising forming, at each of the plurality of transparent regions, a respective one of the plurality of holes.

8. A chip-scale packaging process for wafer-level camera manufacture, comprising:

aligning an image sensor wafer with an interposer wafer such that a plurality of image sensor pixel arrays of the image sensor wafer are aligned with a plurality of transparent regions formed by a photoresist pattern disposed on a first side of the interposer wafer;

forming a plurality of holes through the interposer wafer based on the photoresist pattern;

bonding the aligned image sensor wafer to the first side of the interposer wafer;

dicing the bonded image sensor wafer and interposer wafer into a plurality of image sensors with interposers, such that each image sensor with interposer includes a respective one of the plurality of transparent regions;

dicing an optics component wafer into a plurality of optics components;

aligning each of the plurality of optics components with a respective one of the plurality of image sensors with interposers based on the transparent region of the respective image sensor with interposer; and bonding each of the plurality of optics components to its respective image sensor with interposer, thereby forming a plurality of wafer-level cameras.

9. The process of claim 8, each of the plurality of transparent regions being shaped for aligning with a respective pixel array of the plurality of image sensor pixel arrays.

10. The process of claim 9, further comprising aligning the image sensor wafer with the interposer wafer to provide overlap for die bonding together.

11. The process of claim 8, the step of bonding each of the plurality of optics components to its respective image sensor with interposer comprising adjusting fine camera focus by applying a thin layer of glue between each of the plurality of optics components and its respective image sensor with interposer to adjust a back focal distance based on optical properties of the optics component.

12. The process of claim 8, the step of forming the plurality of holes comprising forming, at each of the plurality of transparent regions, a respective one of the plurality of holes.

13. A chip-scale packaging process for wafer-level camera manufacture, comprising:

disposing a photoresist pattern on a first side of an interposer wafer to form a plurality of transparent regions;

forming, at each of the plurality of transparent regions, a respective one of a plurality of holes through the interposer wafer;

dicing the interposer wafer into a plurality of interposers such that each interposer includes a respective one of the plurality of transparent regions;

dicing an optics component wafer into a plurality of optics components, wherein each of the plurality of optics components has at least one lens;

dicing an image sensor wafer into a plurality of image sensors, wherein each of the plurality of image sensors has a pixel array;

aligning each of the plurality of optics components with a respective one of the plurality of image sensors and a respective one of the plurality of interposers, based on the transparent region of the interposer; and bonding each of the plurality optics components and each of the plurality of image sensors to the opposing respective sides of a respective one of the plurality of interposers, thereby forming a plurality of wafer-level cameras.

14. The process of claim 13, further comprising aligning the at least one lens of each of the plurality of optics components with the transparent region of the respective one of the plurality of interposers, and aligning the pixel array of each of the plurality of image sensors with the transparent region of the respective one of the plurality of interposers.

* * * * *